(12) United States Patent
Kim et al.

(10) Patent No.: US 10,032,811 B2
(45) Date of Patent: Jul. 24, 2018

(54) IMAGE SENSOR AND METHOD FOR FABRICATING THE SAME

(71) Applicant: SK hynix Inc., Gyeonggi-do (KR)

(72) Inventors: Yeoun-Soo Kim, Gyeonggi-do (KR);
Kyoung-Oug Ro, Gyeonggi-do (KR);
Jong-Hyun Je, Gyeonggi-do (KR);
Do-Hwan Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 45 days.

(21) Appl. No.: 15/145,300

(22) Filed: May 3, 2016

(65) Prior Publication Data

US 2016/0247844 A1    Aug. 25, 2016

Related U.S. Application Data

(62) Division of application No. 14/106,802, filed on Dec. 15, 2013, now Pat. No. 9,356,068.

(30) Foreign Application Priority Data

Sep. 2, 2013  (KR) .................. 10-2013-0104760

(51) Int. Cl.
  *H01L 27/146*  (2006.01)
(52) U.S. Cl.
  CPC .... *H01L 27/14605* (2013.01); *H01L 27/1464* (2013.01); *H01L 27/14621* (2013.01); *H01L 27/14645* (2013.01); *H01L 27/14683* (2013.01); *H01L 27/14685* (2013.01); *H01L 27/14687* (2013.01); *H01L 27/14698* (2013.01); *H01L 27/14627* (2013.01)

(58) Field of Classification Search
  CPC ......... H01L 27/14634; H01L 27/14636; H01L 27/14609
  See application file for complete search history.

(56) References Cited

U.S. PATENT DOCUMENTS

2005/0103983 A1* 5/2005 Yamaguchi ....... H01L 27/14621
                                                  250/214.1
2006/0163618 A1    7/2006 Park

OTHER PUBLICATIONS

Office Action issued by the State Intellectual Property Office dated Feb. 24, 2018.

* cited by examiner

*Primary Examiner* — Mohammad Choudhry
(74) *Attorney, Agent, or Firm* — IP & T Group LLP

(57) ABSTRACT

An image sensor may include a substrate having photoelectric conversion regions respectively formed on a plurality of pixels and charge trap regions overlapping with the respective photoelectric conversion regions and having depths or thicknesses that are different, for each of the respective pixel.

5 Claims, 15 Drawing Sheets

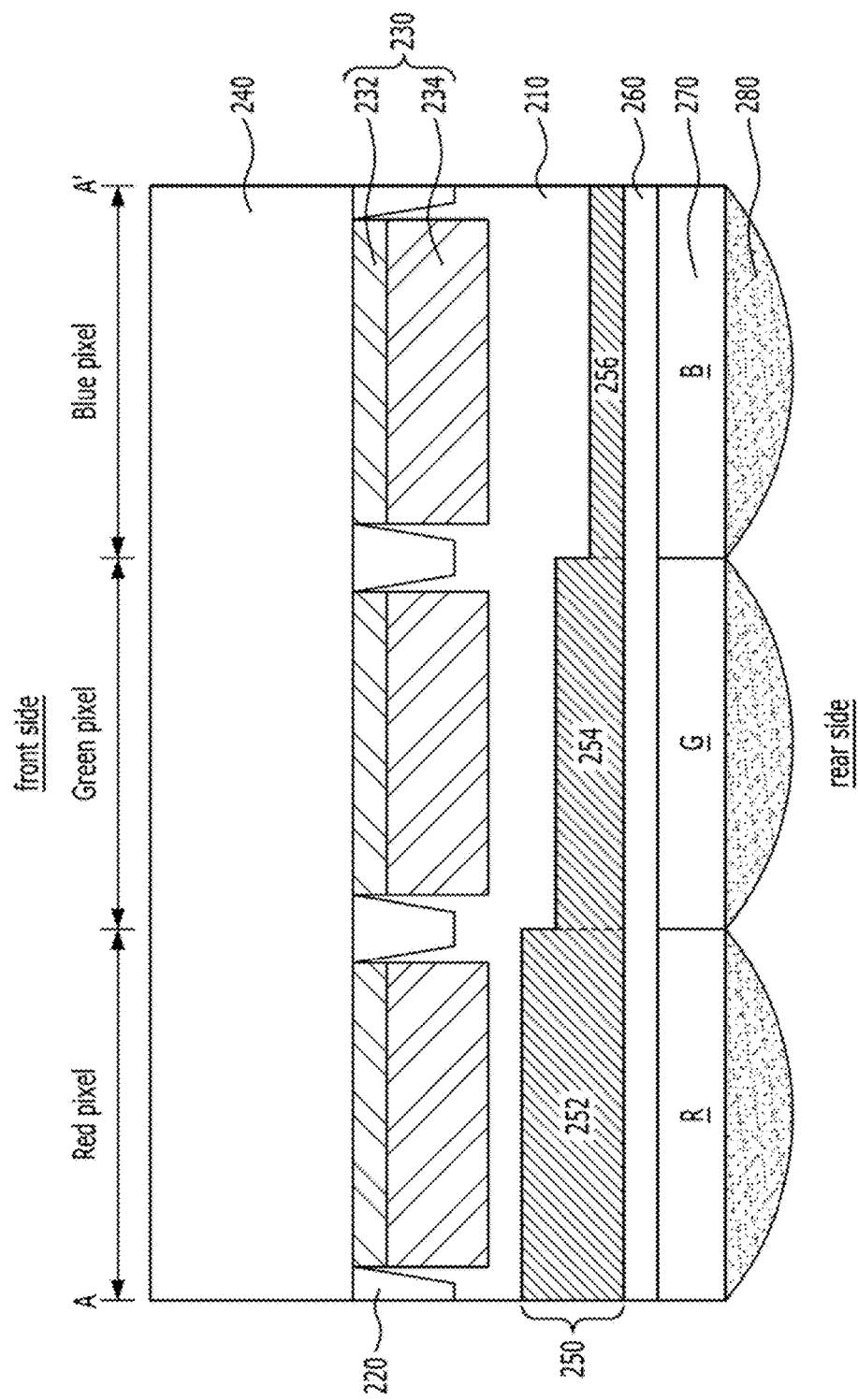

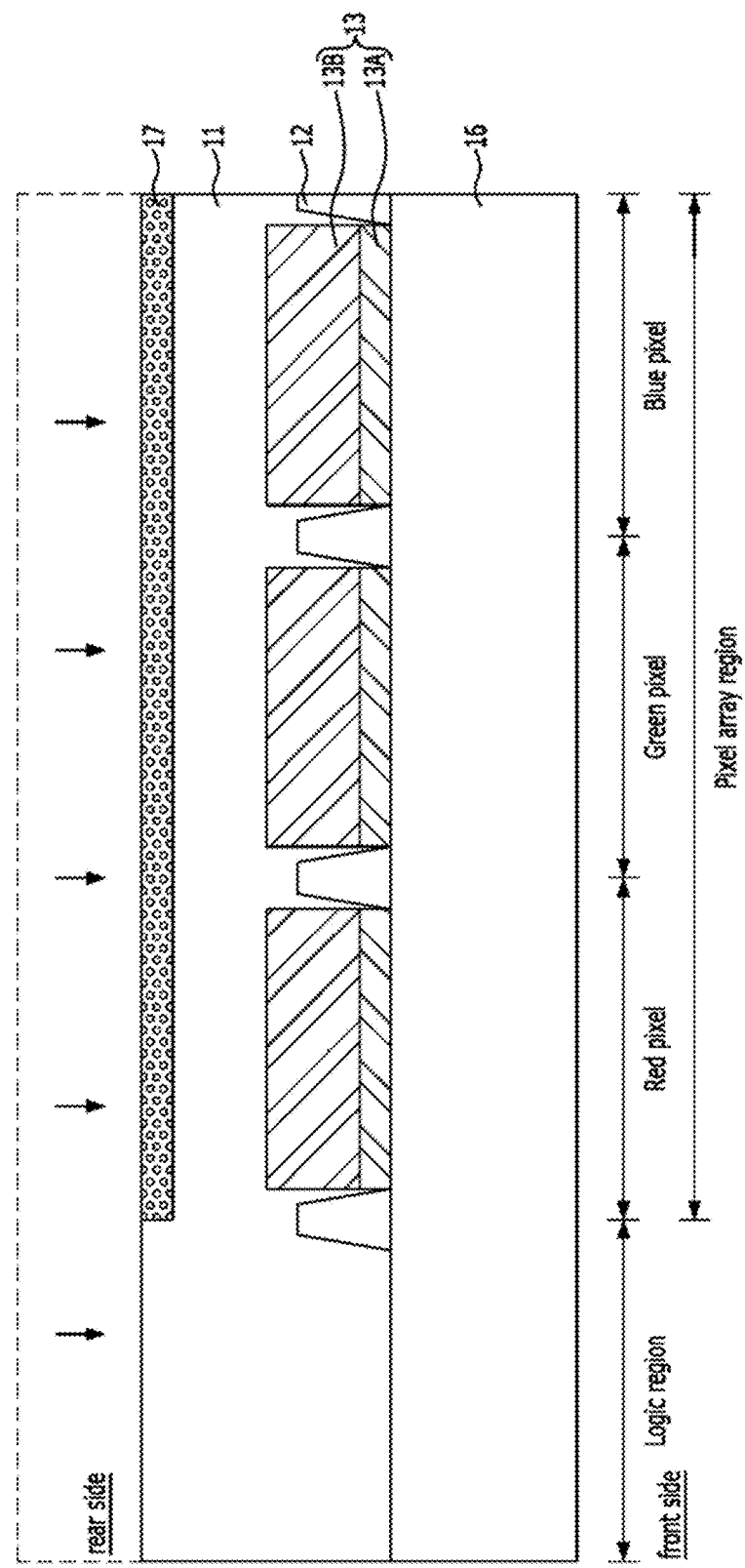

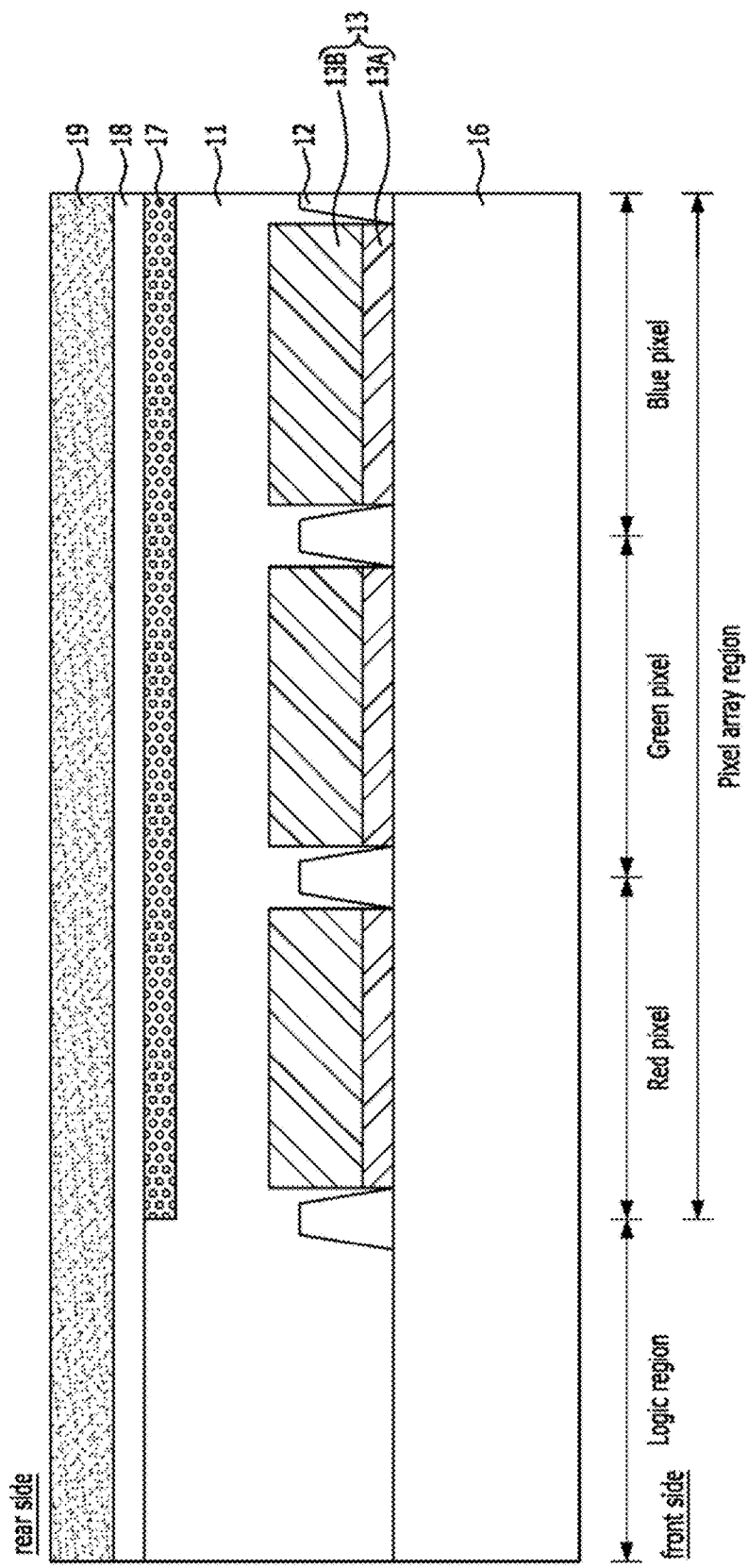

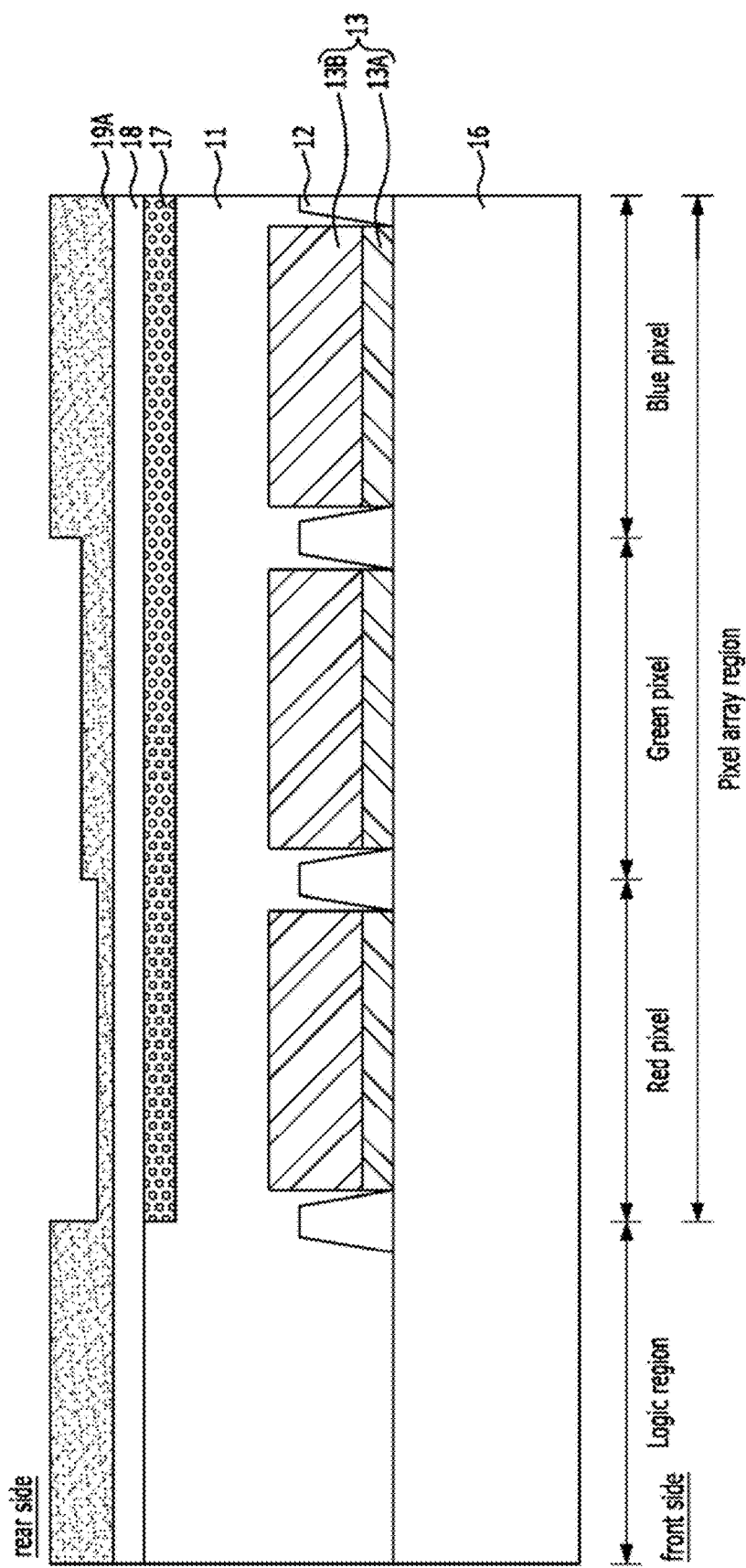

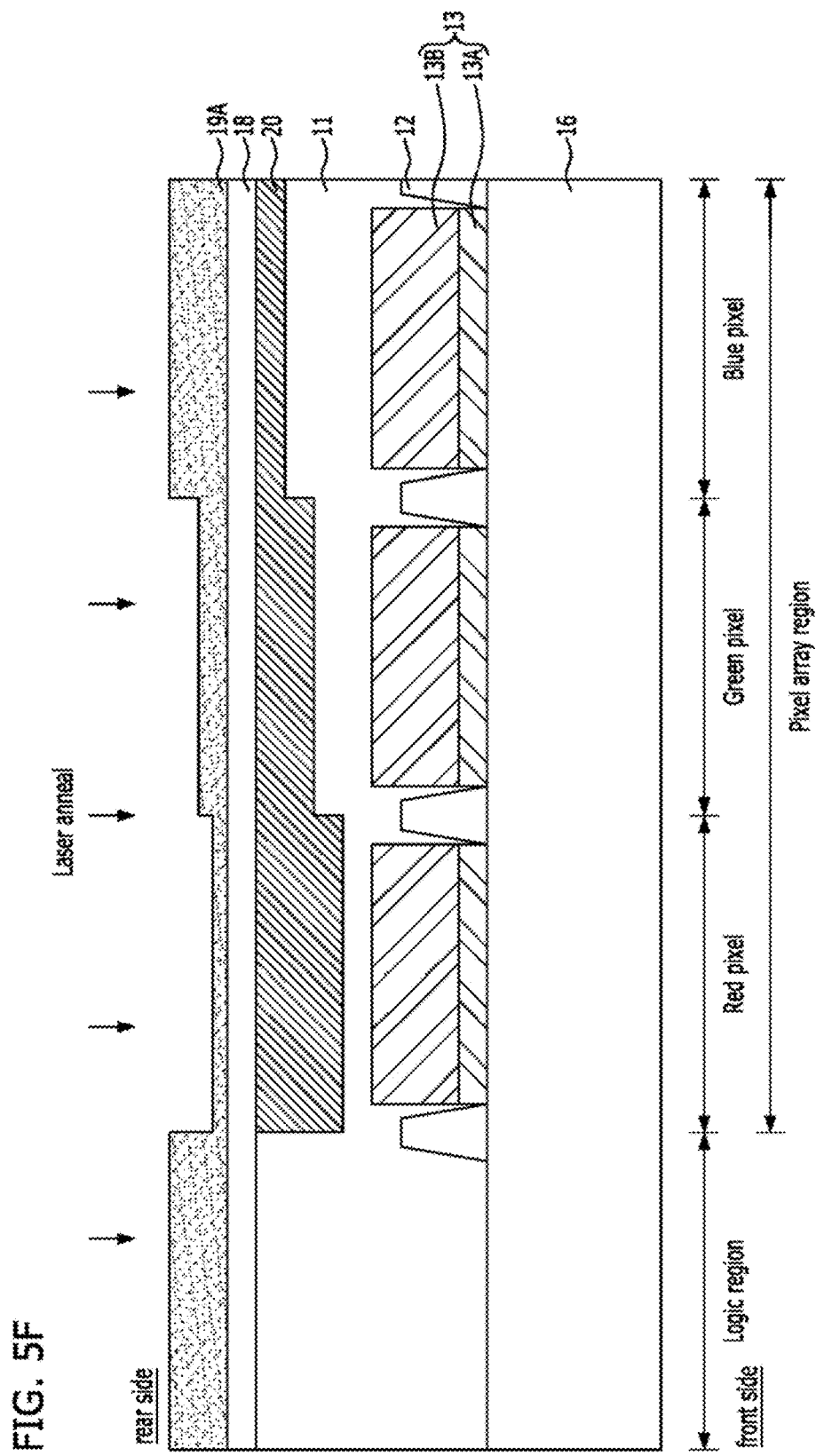

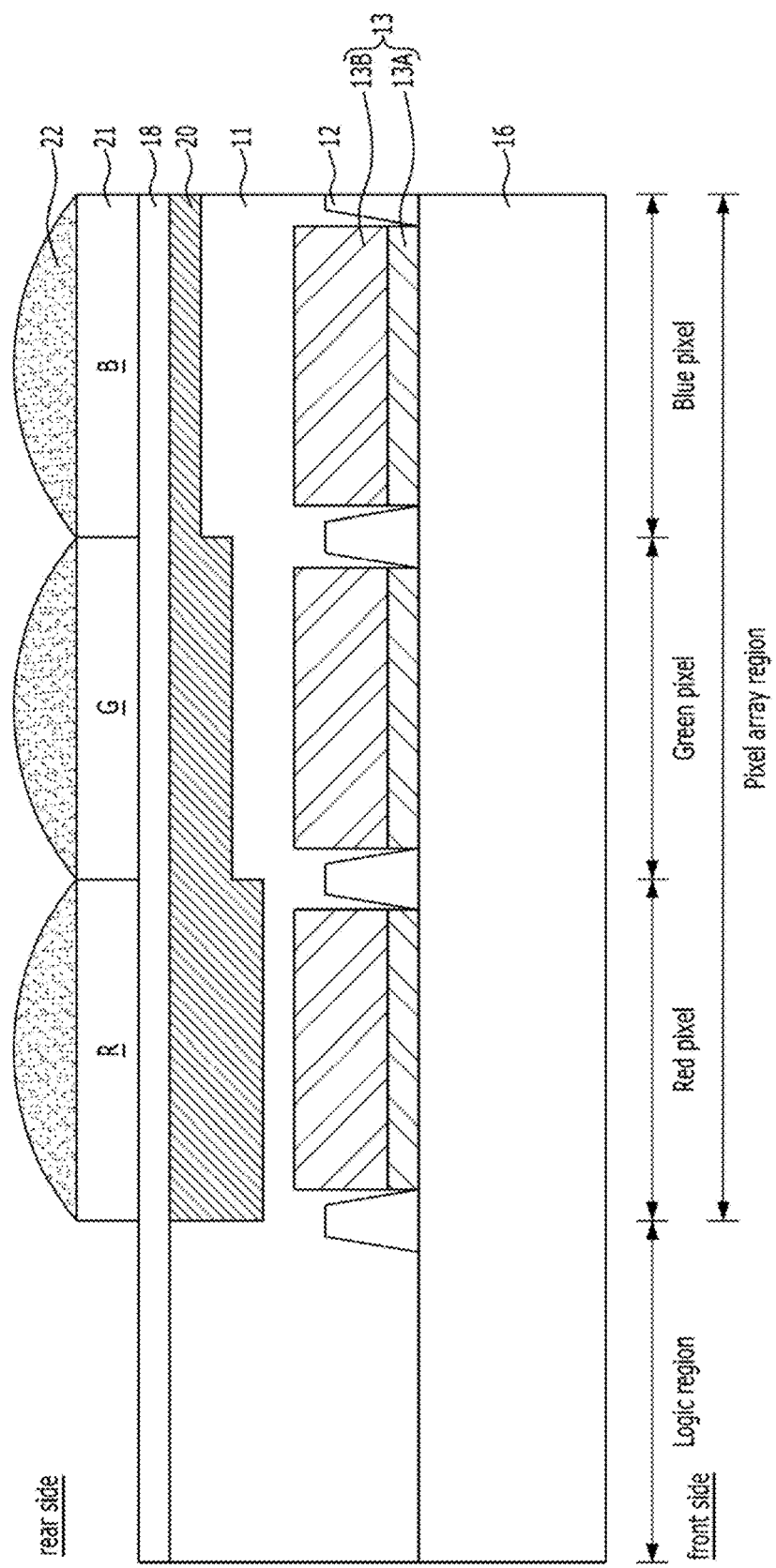

IMAGE SENSOR AND METHOD FOR FABRICATING THE SAME

CROSS-REFERENCE TO RELATED APPLICATIONS

This application is a division of U.S. patent application Ser. No. 14/106,802 filed on Dec. 15, 2013, which claims priority of Korean Patent Application No. 10-2013-0104760, filed on Sep. 02, 2013.The disclosure of each of the foregoing applications is incorporated herein by reference in its entirety.

BACKGROUND

1. Field

Exemplary embodiments of the present invention relate to fabrication of a semiconductor device, and more particularly to an image sensor and method for fabricating the same.

2. Description of the Related Art

An image sensor is a device for converting an optical image into an electrical signal. Image sensors are generally categorized as charge coupled device (CCD) types and CMOS image sensor (CIS) types. The image sensor has a plurality of pixels disposed in the form of a 2 dimensional matrix. Each of the plurality of pixels outputs a pixel signal corresponding to incident light. The pixel accumulates a photocharge corresponding to the incident light through a photoelectric conversion element represented by a photodiode and outputs the pixel signal based on the accumulated photocharge.

A dark current is induced due to a charge generated at the surface of substrate where the photoelectric conversion element is disposed in the image sensor. The dark current acts as noise to the pixel signal, and thus deteriorates the properties of the image sensor.

SUMMARY

Various exemplary embodiments of the present invention are directed to an image sensor and method for fabricating the same that may prevent the properties of the image sensor from deteriorating due to the dark current.

In an exemplary embodiment of the present invention, an image sensor may include a substrate including photoelectric conversion regions respectively formed on a plurality of pixels and charge trap regions overlapping with the respective photoelectric conversion regions and having depths or thicknesses that are different, for each of the respective pixel.

In an exemplary embodiment of the present invention, an image sensor may include a substrate including a first pixel suitable for generating a first pixel signal in response to an incident light of a first wavelength band and a second pixel suitable for generating a second pixel signal in response to an incident light of a second wavelength band, first and second photoelectric conversion regions respectively formed on the substrate corresponding to the first pixel and the second pixel, a first charge trap region overlapped with the first photoelectric conversion region, and a second charge trap region overlapped with the second photoelectric conversion region, wherein a wavelength of the second wavelength band is shorter than a wavelength of the first wavelength band, and a depth or thickness of the second charge trap region is smaller than a depth or thickness of the first charge trap region.

In an exemplary embodiment of the present invention, a method of fabricating an image sensor may include forming photoelectric conversion regions on a front side of a substrate having a plurality of pixels to correspond to the respective pixels, forming a dopant-injection region through ion-injection of a dopant to a rear side of the substrate, selectively forming a barrier pattern on the rear side of the substrate for each of the plurality of pixels and forming charge trap regions having different depths or thicknesses from each other for the respective pixels utilizing laser annealing to activate the dopant of the dopant-injection region.

In accordance with the above embodiments of the present invention, the image sensor may prevent generation of the dark current by the charge trap region that has depth corresponding to incident light inputted to each of the plurality of pixels. The image sensor may also prevent the sensitivity of the image sensor from being reduced by the charge trap region. Further, the image sensor may prevent crosstalk between adjacent pixels.

Still further, the reflectance or transmittance of a laser may be controlled by using a barrier pattern selectively formed in each of the plurality of pixels, which makes it possible that lasers with various intensities illuminate the plurality of respective pixels at the same time, charge trap regions with various depths are easily formed for the plurality of respective pixels, thus the fabrication process becomes simpler and fabrication yield is improved.

BRIEF DESCRIPTION OF THE DRAWINGS

FIG. 4A is a cross-sectional view illustrating the image sensor in accordance with an embodiment of the present invention, taken along a line A-A' illustrated in FIG. 2;

FIGS. 5A to 5G are cross-sectional views illustrating a method for fabricating an image sensor in accordance with an embodiment of the present invention;

DETAILED DESCRIPTION

Figure 1:
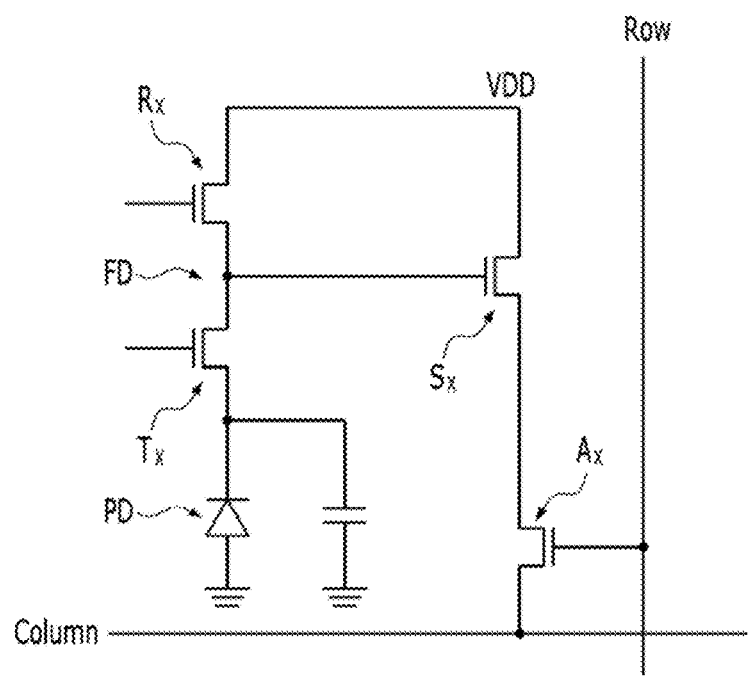
FIG. 1 is an equivalent circuit diagram illustrating an image sensor in accordance with an embodiment of the present invention.

Various exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

Image sensors are generally categorized as charge coupled device (CCD) types and the CMOS image sensor (CIS) types. The CIS type image sensors are categorized as front-side illumination image sensors (FIS) and back-side illumination image sensors (BIS). The back-side illumination image sensor (BIS) has better operation properties and better fabrication yield than the other types of image sensors, for example the charge coupled devices (CCDs) or the front-side illumination image sensors (FISs), but there is frequent induction of the dark current. Set forth below is description with example of the back-side illumination image sensor (BIS).

In the description, a first conductivity type and a second conductivity are complementary to each other. For example, when the first conductivity type is P-type, then the second conductivity type is N-type. When the first conductivity type is N-type, then the second conductivity type is P-type. Set forth below is description with an example that the first conductivity type is P-type and the second conductivity type is N-type.

Exemplary embodiments of the present invention provide an image sensor and method for fabricating the same that may prevent deterioration properties of the image sensor due to the dark current. The dark current acts as noise to a pixel signal generated by each pixel included in an image sensor having a plurality of pixels, and thus changes the properties of the image sensor. For example, signal to noise ratio (SNR) is increased, which reduces the sensitivity of the image sensor.

According to exemplary embodiments of the present invention, the image sensor may have a charge trap region that is formed to correspond to a photoelectric conversion region of each of the plurality of pixels and has a depth corresponding to the wave band of incident light inputted to each of the plurality of pixels.

The charge trap region traps charge that induces the dark current thus preventing the dark current from being generated. The charge trap region formed to correspond to the photoelectric conversion region may overlap with the photoelectric conversion region.

Overlap of the charge trap region and the photoelectric conversion region may represent layered disposition, which means that the charge trap region overlaps with the photoelectric conversion region when viewed from the top while the charge trap region and the photoelectric conversion region may separate from each other in different layers or may be in contact with each other as upper and lower layers.

Set forth below is a description of basic operation of an image sensor in accordance with an embodiment of the present invention and the prior art.

FIG. 1 is an equivalent circuit diagram illustrating an image sensor in accordance with an embodiment of the present invention.

Figure 2:
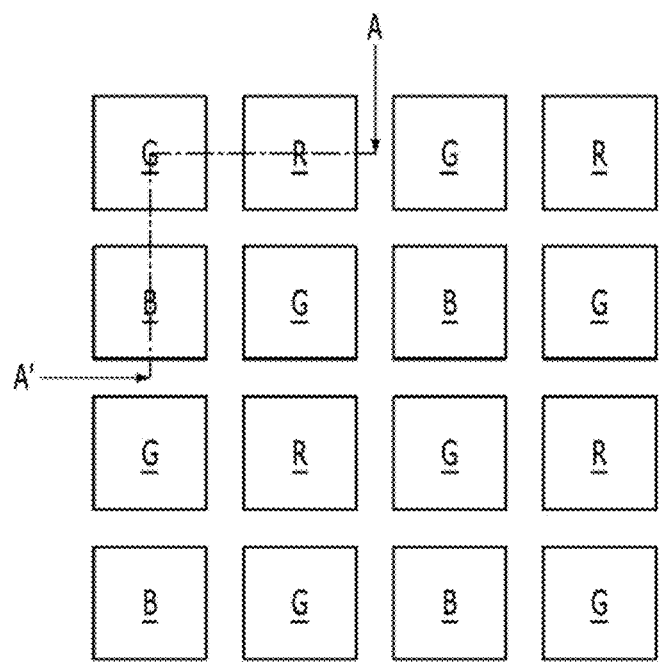
FIG. 2 is a plane diagram illustrating a pixel array of the image sensor in accordance with an embodiment of the present invention.

FIG. 2 is a plane diagram illustrating a pixel array of the image sensor in accordance with an embodiment of the present invention.

Figure 3:
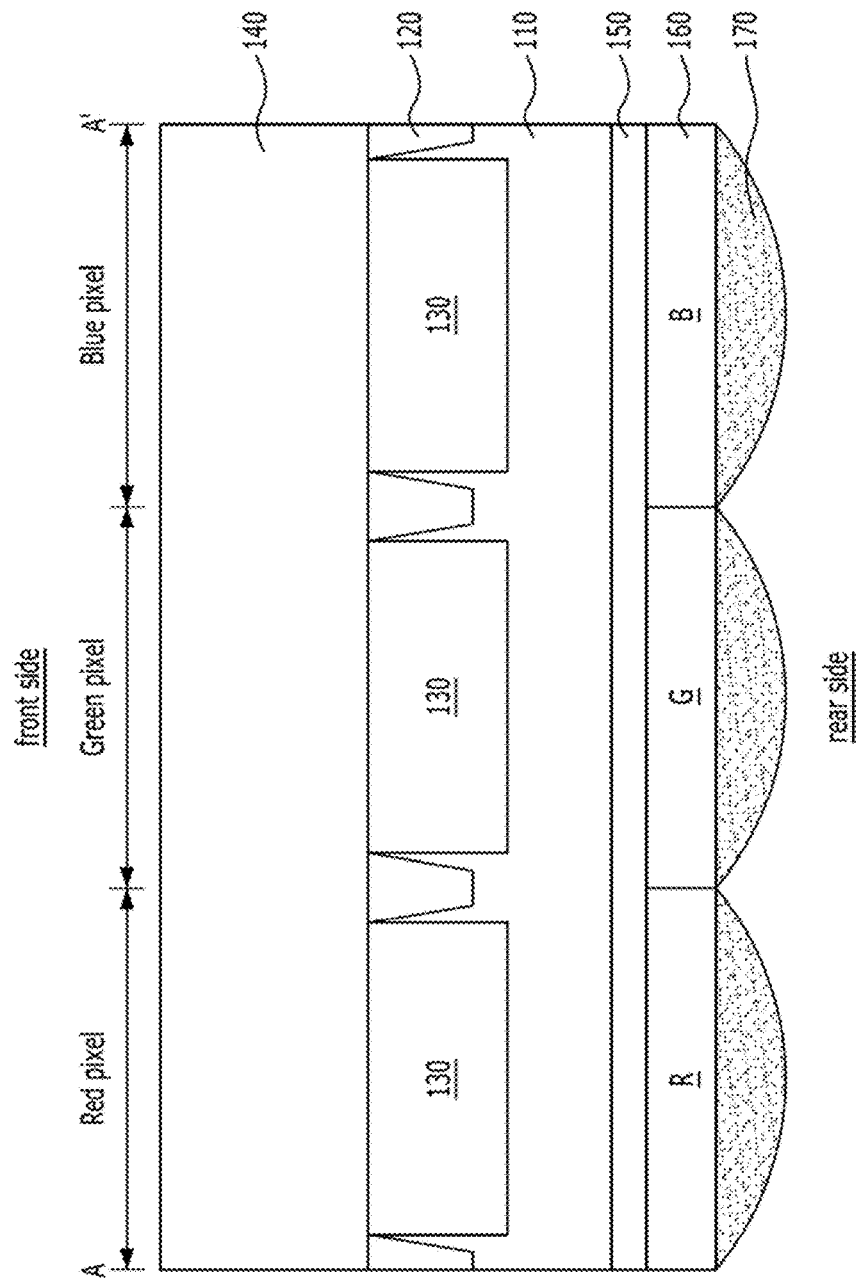
FIG. 3 is a cross-sectional view illustrating a typical image sensor taken along a line A-A' illustrated in FIG. 2.

FIG. 3 is a cross-sectional view illustrating a typical image sensor taken along a line A-A' illustrated in FIG. 2.

Referring to FIG. 1, each of the plurality of pixels in the image sensor in accordance with an embodiment of the present invention may include a photodiode PD for serving as a photoelectric conversion region, a transfer transistor Tx, a selection transistor Sx, a reset transistor Rx and an access transistor Ax.

A transfer gate of the transfer transistor Tx may be extended to the inside of the substrate. The transfer gate of the transfer transistor Tx may have a form of one of a recess gate, a saddle-fin gate and a buried gate. A drain of the transfer transistor Tx may be identified as a floating diffusion region FD. The floating diffusion region FD may be a source of the reset transistor Rx.

The floating diffusion region FD may be electrically connected to a selection gate of the selection transistor Sx. The selection transistor Sx and the reset transistor Rx may be connected in series.

The selection transistor Sx the reset transistor Rx and the access transistor Ax may be shared by adjacent pixels, which improve the integration degree of the image sensor.

The operation of the image sensor in accordance with an embodiment of the present invention is described below with reference to FIG. 1.

Under absence of incident light, charge remaining n the floating diffusion region FD is emitted by applying a power voltage VDD to a drain of the reset transistor Rx and a drain of the selection transistor Sx. After that, with the reset transistor Rx turned off, photocharge or an electron-hole pair is generated in the photodiode PD through external illumination of incident light to the photodiode PD.

The generated hole moves to and is accumulated n P-type dopant region and the generated electron moves to and is accumulated in N-type dopant region. When the transfer transistor Tx is turned on, charge of the accumulated electron and hole is transferred to and accumulated in the floating diffusion region FD. Gate bias of the selection transistor Sx varies in proportion to the accumulated charge, which causes voltage change to a source of the selection transistor Sx.

When the access transistor Ax is turned on a pixel signal due to the charge is read to column line at which the dark current acts as noise to the pixel signal thereby reducing the sensitivity of the image sensor and increasing the signal to noise ratio SNR.

Referring to FIGS. 2 and 3, a typical image sensor has a plurality of pixels, for example, a red pixel (R), a green pixel (G) and a blue pixel (B). A photoelectric conversion region 130 is formed on an area of a substrate 110 corresponding to each pixel. An isolation layer 120 is formed on the substrate 110. An interlayer dielectric layer 140 including a signal generation circuit is formed on the front side of the substrate 110. Formed on the rear side of the substrate 110 are a charge trap region 150, a color filter 160 and a micro-lens 170.

The charge trap region 150 of the typical image sensor prevents generation of the dark current by trapping charges generating the dark current. The charge trap region 150 is dopant region generated through dopant injection and annealing to the rear side of the substrate 110 after a thinning process to the rear side of the substrate 110. The charge trap region 150 is collectively formed for all pixels and thus has a uniform depth or thickness at the level of the rear side of the substrate 110 for all pixels.

As described above the charge trap region 150 of the typical image sensor is collectively formed to have the uniform depth or thickness for all pixels without consideration about the characteristics of each pixel, such as, wavelength of incident light that constrains the image sensor from preventing generation of the dark current.

The color-separated incident light is absorbed at different depths from the rear side of the substrate 110 depending on its waveband or wavelength. The charge trap region 150 with the uniform depth or thickness for all pixels may not properly operate for a pixel for the specific waveband or wavelength.

For example, in a red pixel the color-separated incident light is absorbed relatively deep from the rear side of the substrate 110. The depth or thickness of the charge trap region 150 may be increased for the red pixel but it may deteriorate sensitivity of another pixel for another waveband or wavelength. As an example, for a blue pixel, most of the color-separated incident light is absorbed at the surface of the substrate 110. The charge trap region 150 with an increased depth or thickness traps photocharge for generating a pixel signal for the blue pixel thereby reducing the sensitivity of the blue pixel and the image sensor.

An image sensor according to the embodiment of the present invention that addresses the concern of the typical image sensor is described below. FIG. 4A is a cross-sectional view illustrating the image sensor in accordance with an embodiment of the present invention, taken along a line A-A' illustrated in FIG. 2.

Figure 4B:
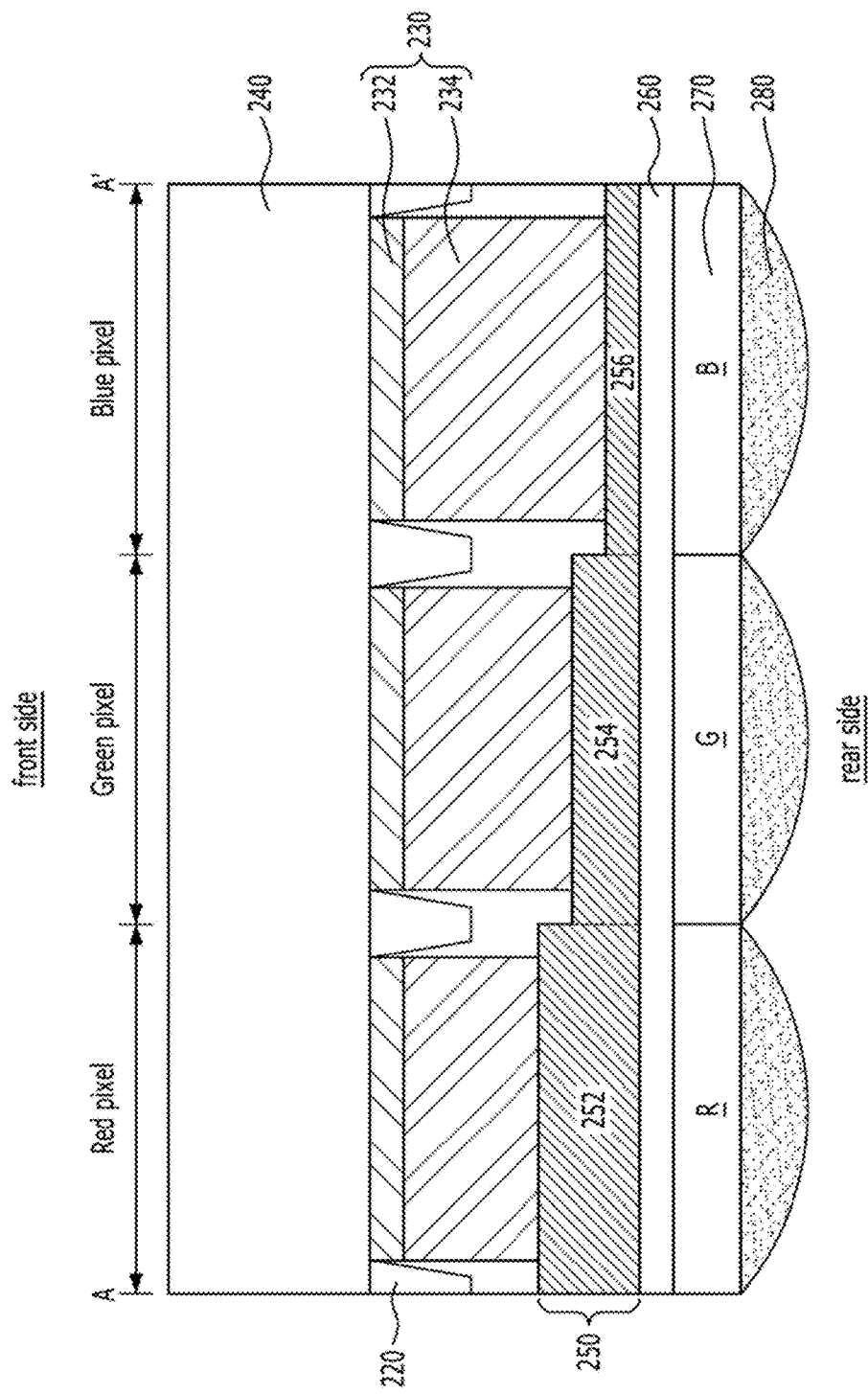
FIG. 4B is a cross-sectional view illustrating the image sensor in accordance with another embodiment of the present invention, taken along a line A-A' illustrated in FIG. 2.

FIG. 4B is a cross-sectional view illustrating the image sensor in accordance with another embodiment of the present invention, taken along a line A-A' illustrated in FIG. 2.

Referring to FIGS. 4A and 4B, the image sensor according to the embodiment of the present invention may include a substrate 210, a photoelectric conversion region 230, an isolation layer 220, an interlayer dielectric layer 240, a charge trap region 250, a buffer layer 260, a color filter 270 and a micro-lens 280.

The substrate 210 may have a plurality of pixels. The photoelectric conversion region 230 may be formed on an area of the substrate 110 corresponding to each pixel. The isolation layer 220 may isolate adjacent pixels from each other. The interlayer dielectric layer 240 may be formed on the front side of the substrate 110 and include a signal generation circuit. The charge trap region 250 may be formed on the rear side of the substrate 110 and have various depths for the respective pixels. The buffer layer 260 may be formed on the rear side of the substrate 110. The color filter 270 may be formed on the buffer layer 260. The micro-lens 280 may be formed on the color filter 270.

The plurality of pixels may include a first pixel for generating a pixel signal corresponding to a first waveband and a second pixel for generating a pixel signal corresponding to a second waveband whose wavelength is shorter than that of the first waveband. For example, if the first pixel is a red pixel, the second pixel may be a green pixel or a blue pixel. If the first pixel is the green pixel, the second pixel may be the blue pixel. The plurality of pixels thus may include the red pixel, the green pixel and the blue pixel. The plurality of pixels may further include a white pixel, a black pixel and an infrared pixel.

The substrate 210 may include a semiconductor substrate. The semiconductor substrate may be in a monocrystal state and include silicon-incorporated material. The substrate 210 may include silicon-incorporated material of the monocrystal. For example, the substrate 210 may be a bulk silicon substrate or a silicon-on-insulator (SOI) substrate including a silicon-epilayer. The substrate 210 may be doped with a dopant of a first conductivity type. The substrate 210 thus may be of the first conductivity type.

The photoelectric conversion region 230 formed on the area of the substrate 110 corresponding to each pixel may include a photo diode. The photoelectric conversion region 230 may include a first dopant region 232 of a first conductivity type and a second dopant region 234 of a second conductivity type. The first dopant region 232 may be formed on the front side of the substrate 210. The second dopant region 234 may be formed under the first dopant region 232. The first dopant region 232 and the second dopant region 234 may be overlapped.

The first dopant region 232 may be formed to be in contact with the front side of the substrate 210 and have a uniform depth or thickness for all of the plurality of pixels. The first dopant region 232 may serve as an electrical barrier preventing the injection of a dark source, for example, an electron, to the second dopant region 234 due to damage of the front side of the substrate 210 caused by a process thereto.

The second dopant region 234 may have a uniform depth or thickness for all of the plurality of pixels as shown in FIG. 4A or various depths or thicknesses through the charge trap region 250 as shown in FIG. 4B. When the depth or thickness of the second dopant region 234 is uniform for all of the plurality of pixels, there may be a distance between the second dopant region 234 and the charge trap region 250. When the depths or thicknesses of the second dopant region 234 varies for all of the plurality of pixels, the second dopant region 234 and the charge trap region 250 may be in contact with each other.

The interlayer dielectric layer 240 may include one or more selected from a group comprising an oxide material, a nitride material and an oxynitride material. The signal generation circuit formed in the interlayer dielectric layer 240 may include a plurality of transistors (not illustrated), a metal interconnection of multilayer (not illustrated) and a contact plug (not illustrated) for connecting the plurality of transistors and the metal interconnection of multilayer.

The signal generation circuit may generate or output a pixel signal or an electrical signal corresponding to photocharge generated from the photoelectric conversion region 230. The plurality of transistors may include a transfer transistor Tx, a reset transistor Rx, a selection transistor Sx and an access transistor Ax.

The buffer layer 260 formed on the rear side of the substrate 210 may protect the rear side of the substrate 210 during a process. The buffer layer 260 may eliminate defects formed at the rear side of the substrate 210 during a thinning process. The buffer layer 260 may control intensity of a laser radiated to the substrate 210 during laser annealing for forming the charge trap region 250. The buffer layer 260 may be a dielectric layer. The buffer layer 260 may be one selected from a group comprising an oxide material, a nitride material and an oxynitride material. For example, the buffer layer 260 may be an oxide layer, which may be formed through thermal oxidation.

The charge trap region 250 for trapping charges generating the dark current that prevents generation of the dark current may be formed to contact the rear side of the substrate 210. The charge trap region 250 and the photoelectric conversion region 230 may be vertically in contact with each other. The depth or thickness of the charge trap region 250 may depend on the wavelength of the incident light, which prevents generation of the dark current by considering the depth at which the incident light is absorbed and prevents deterioration of the image sensor caused by the charge trap region 250.

The depth or thickness of the charge trap region 250 may be proportional to the wavelength of the incident light. For example, the depth or thickness of a first charge trap region 252 formed on the red pixel may be greater than those of second and third charge trap regions 254 and 256 formed on the green pixel and the blue pixel, respectively. The depth or thickness of the second charge trap region 254 may be greater than that of the third charge trap region 256.

Specifically, the first charge trap region 252 may have a depth or thickness ranging from 0.6 μm to 1 μm at the level of the rear side of the substrate 110. The second charge trap region 254 may have a depth or thickness ranging from 0.3 μm to 0.6 μm at the level of the rear side of the substrate 210. The third charge trap region 256 may have a depth or thickness ranging from 0.1 μm to 0.3 μm at the level of the rear side of the substrate 210.

The charge trap region 250 may be of the first conductivity type. The charge trap region 250 may be formed through ion-injection of the dopant of the first conductivity type. Doping concentration of the charge trap region 250 may be greater than that of the substrate 210. The charge trap region 250 may have constant doping concentration regardless of the depth or thickness at the level of the rear side of the substrate 210. The charge trap region 250 may have doping concentration decreasing along a propagation direction of the incident light from the rear side to the front side of the substrate 210. The latter may be more favourable to better sensitivity of the image sensor than the former.

According to the embodiment of the present invention, the image sensor may have the charge trap region 250 having the depth or thickness corresponding to the incident light inputted to respective pixels, which may prevent generation of dark current, deterioration of sensitivity due to the charge trap region 250 and crosstalk between the adjacent pixels.

FIGS. 5A to 5G are cross-sectional views illustrating a method for fabricating the image sensor in accordance with an embodiment of the present invention.

Set forth below is description for an embodiment of a fabrication method of the image sensor shown in FIG. 4A with reference to FIGS. 5A to 5G.

Figure 5A:
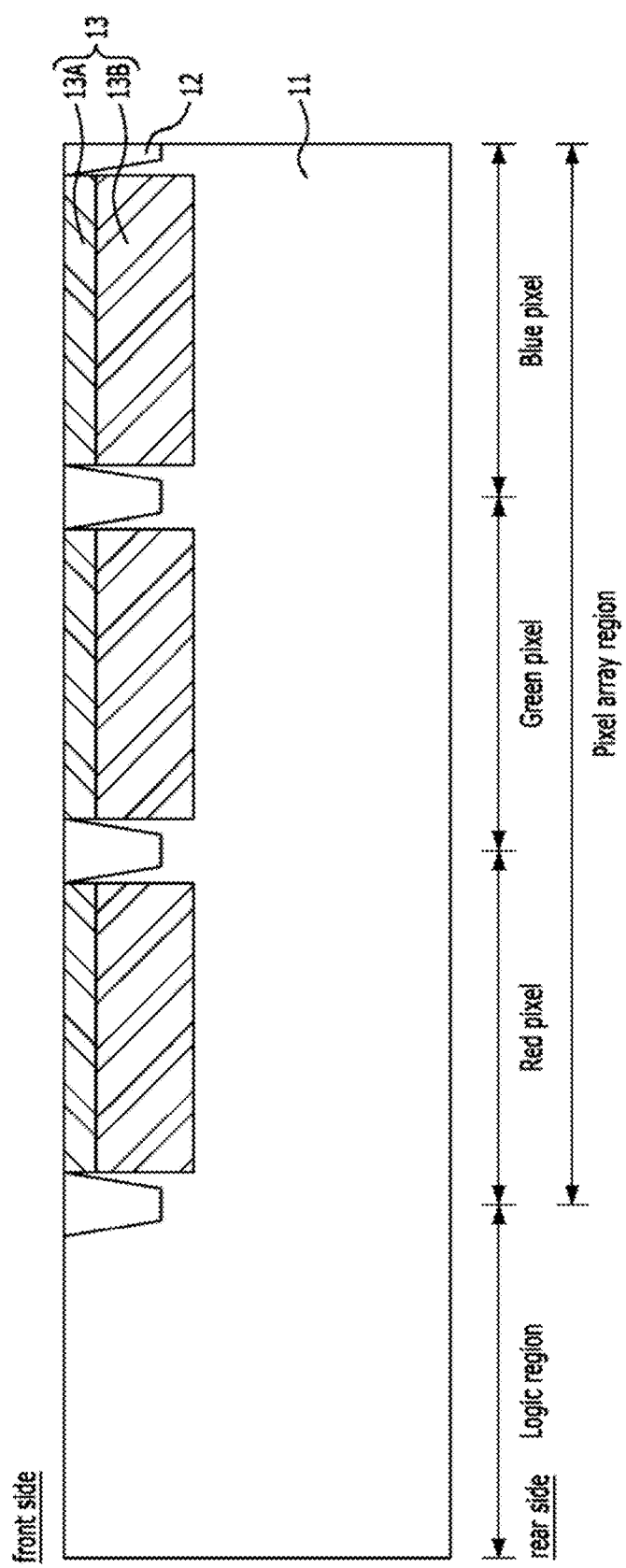

Referring to FIG. 5A, a substrate 11 having a logic region and a pixel array region may be prepared. The pixel array region may include a plurality of pixels arranged in a 2 dimensional matrix.

The plurality of pixels may include a first pixel for generating a pixel signal corresponding to a first waveband and a second pixel for generating a pixel signal corresponding to a second waveband whose wavelength is shorter than that of the first waveband. For example, if the first pixel is a red pixel, the second pixel may be a green pixel or a blue pixel. If the first pixel is the green pixel, the second pixel may be the blue pixel. The plurality of pixels thus may include the red pixel, the green pixel and the blue pixel. The plurality of pixels may further include a white pixel, a black pixel and an infrared pixel.

The substrate 11 may include a semiconductor substrate. The semiconductor substrate may be in a monocrystal state and include silicon-incorporated material. The substrate 11 may include silicon-incorporated material of the monocrystal. The substrate 11 may be doped with a dopant of a first conductivity type. The substrate 11 thus may be of the first conductivity type.

Next, an isolation layer 12 is formed on the substrate 11 along the border between the plurality of pixels. The isolation layer 12 may be formed by a shallow trench isolation (STI) process of forming an isolation trench and gap-filling the trench with dielectric material.

Then the photoelectric conversion region 13 is formed on the substrate 11 to correspond to each pixel. The photoelectric conversion region 13 may be formed with a photo diode.

The photoelectric conversion region 13 may be formed so that a first dopant region 13A and a second dopant region 13B may be overlapped. The charge trap region 13 may be formed through ion-injection of a dopant to the front side of the substrate 11 and activation of the ion-injected dopant.

Figure 5B:
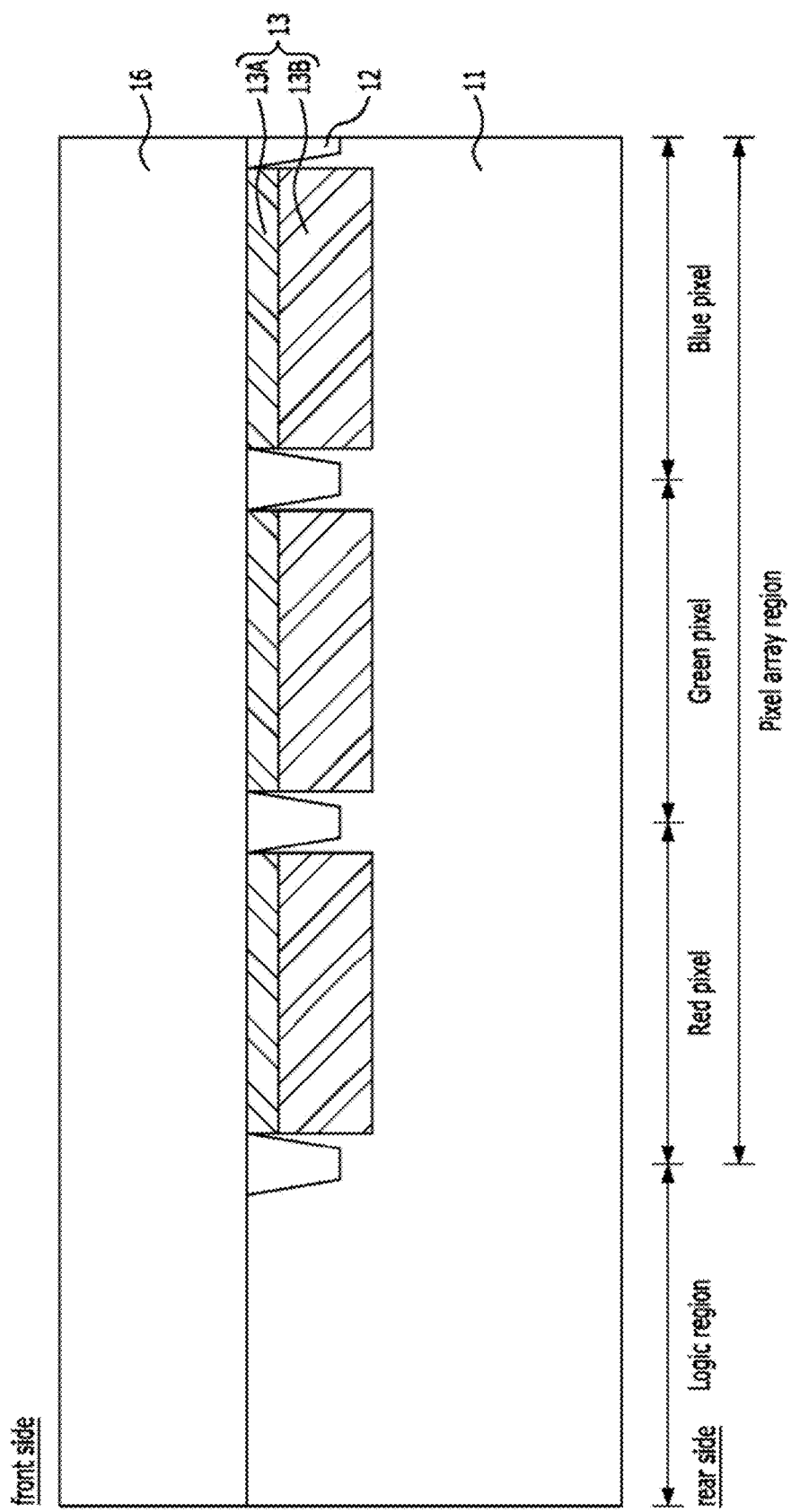

Referring to FIG. 5B, an interlayer dielectric layer 16 including a signal generation circuit is formed on the front side of the substrate 11 of the pixel array region. The interlayer dielectric layer 16 may include one or more selected from a group comprising an oxide material, a nitride material and an oxynitride material. The signal generation circuit formed in the interlayer dielectric layer 16 may include a plurality of transistors (not illustrated), a metal interconnection of multilayer (not illustrated) and a contact plug (not illustrated) for connecting the plurality of transistors and the metal interconnection of multilayer.

The signal generation circuit may generate or output a pixel signal or an electrical signal corresponding to photocharge generated from the photoelectric conversion region 13. The interlayer dielectric layer 16 may include a logic circuit formed on the front side of the substrate 11 of the logic region.

Referring to FIG. 5C, the thickness of the substrate 11 is reduced through a thinning process to the rear side of the substrate 11 so that a range of the incident light inputted to the photoelectric conversion region 13 is reduced and thus light-interception efficiency is improved. The thinning process may be performed through backgrinding or polishing.

Next, a dopant-injection region 17 is formed on the surface of the rear side of the substrate 11 through ion-injection of a dopant of a first conductivity type to the rear side of the substrate 11. The dopant-injection region 17 may be formed on the rear side of the substrate 11 of the pixel array region as shown in the figure or on the entire rear side of the substrate 11 including the pixel array region and the logic region. The dopant-injection region has a status of the dopant being injected to the substrate 11 but not activated. The dopant of the first conductivity type may be Boron.

Referring to FIG. 5D, a buffer layer 18 may be formed on the rear side of the substrate 11. The buffer layer 260 may eliminate defects formed at the rear side of the substrate 210 during a thinning process. The buffer layer 18 may formed to have a uniform depth or thickness over the entire substrate 11. The buffer layer 18 may repair damage to the rear side of the substrate 11 caused by a thinning process and the process of forming the dopant-injection region 17 or ion-injection. The buffer layer 18 may protect the rear side of the substrate 11 during subsequent processes. The buffer layer 18 may be a dielectric layer.

The buffer layer 18 may be one selected from a group comprising an oxide material, a nitride material and an oxynitride material. For example, the buffer layer 18 may be formed with an oxide layer through thermal oxidation. The oxide layer may be formed with a silicon oxide ($SiO_2$).

Next, a barrier layer 19 is formed on the buffer layer 18. The barrier layer 19 may be formed to have a uniform depth or thickness over the entire substrate 11. The barrier layer 19 may control intensity of a laser radiated to the rear side of the substrate 11 during subsequent laser annealing for activating the dopant injected to the dopant-injection region 17. The buffer layer 18 may also control the intensity of the laser.

The barrier layer 19 may be a dielectric layer. The barrier layer 19 may be one selected from a group comprising an oxide material, a nitride material and an oxynitride material. For example, the barrier layer 19 may be formed with a nitride layer. The nitride layer may be formed with a silicon nitride ($Si_3N_4$).

Referring to FIG. 5E, a plurality of barrier patterns 19A are formed through selectively etching the barrier layer 19 so that the laser is radiated to the substrate 11 with intensity required for the respective pixels in the subsequent laser annealing. The plurality of barrier patterns 19A is selectively formed on the rear side of the substrate 11 for the respective pixels, due to various reflectance or transmittance of the laser depending on the various depths or thicknesses of the plurality of barrier patterns 19A in the stack structure of the buffer layer 18 and the plurality of barrier patterns 19A.

For example, the buffer layer 18 of the silicon oxide ($SiO_2$) has an uniform depth or thickness of 48 nm for all of the plurality of pixels and the plurality of barrier patterns 19A of silicon nitride ($Si_3N_4$) has various depths or thicknesses, ranging from 0 nm to 36 nm, for the respective pixels. A barrier pattern 19A corresponding to the red pixel has the least depth or thickness among the plurality of barrier patterns. A barrier pattern 19A corresponding to the blue pixel has the greatest depth or thickness among the plurality of barrier patterns. A barrier pattern 19A corresponding to the green pixel has a depth or thickness between depths or thicknesses of the barrier pattern corresponding to the red pixel and the barrier pattern corresponding to the blue pixel.

The barrier pattern 19A corresponding to the green pixel has the lesser depth or thickness than the depth or thickness of the barrier pattern 19A corresponding to the blue pixel. The barrier pattern 19A corresponding to the red pixel may not be formed.

The reflectance or transmittance of a laser fluctuates like a wave depending on the depth or thickness of the plurality of barrier patterns 19A. The reflectance or transmittance of the laser may be changed depending on a material type or stack structure of the plurality of barrier patterns 19A. The present invention may be embodied in different forms and should not be construed as limited to the embodiments set forth herein.

For example, the buffer layer 18 of the silicon oxide ($SiO_2$) has a uniform depth or thickness of 48 nm for all of the plurality of pixels and the plurality of barrier patterns 19A of silicon nitride ($Si_3N_4$) has various depths or thicknesses, ranging from 36 nm to 70 nm, for the respective pixels. A barrier pattern 19A corresponding to the red pixel has the greatest depth or thickness among the plurality of barrier patterns. A barrier pattern 19A corresponding to the blue pixel has the least depth or thickness among the plurality of barrier patterns. A barrier pattern 19A corresponding to the green pixel has a depth or thickness between depths or thicknesses of the barrier pattern corresponding to the red pixel and the barrier pattern corresponding to the blue pixel.

Referring to FIG. 5F, a laser annealing process is performed that radiates the laser to the rear side of the substrate 11 where the buffer layer 18 and the plurality of barrier pattern 19A are stacked and activating the dopant injected to the dopant-injection region 17, which may form a charge trap region 20.

The intensity of the laser penetrating the buffer layer 18 and the plurality of barrier patterns 19A and radiating to the rear side of the substrate 11 may be controlled depending on the depth or thickness of the plurality of barrier patterns 19A.

The depth or thickness of a dopant region or the charge trap region 20 activated by the laser may increase as intensity or energy of the laser increases. The charge trap region 20 with various depths or thicknesses for respective pixels may be formed through the laser annealing process with the plurality of barrier patterns 19A that are selectively formed or have various depths or thicknesses for respective pixels.

The laser annealing is used as an annealing process for forming the charge trap region 20 to recover a crystal state of the damaged rear side of the substrate 11 to a monocrystal state and prevent damage of formed structure during the annealing process.

Referring to FIG. 5G, after removal of the plurality of barrier patterns 19A, a color filter 21 is formed on the buffer layer 18 and a micro-lens 22 is formed on the color filter 21.

The subsequent processes to complete fabrication of the image sensor are known art.

The structure and fabrication method of the plurality of barrier pattern 19A for allowing a laser to radiate with various intensities for respective pixels may be implemented by various embodiments other than the embodiment described above.

For example, a plurality of barrier patterns 19A may be formed by forming a laminate where a plurality of barrier layers are stacked then selectively etching one or more of the plurality of barrier layers. The plurality of barrier layers may be a laminate in which heterogeneous material layers are alternatively stacked or a laminate in which various material layers differing from each other are stacked.

According to the embodiment of the present invention, the image sensor may have the charge trap region 20 having depths or thicknesses corresponding to the incident light inputted to respective pixels, which may prevent generation of dark current, deterioration of sensitivity due to the charge trap region 20 and crosstalk between the adjacent pixels.

According to the embodiment of the present invention, reflectance or transmittance of the laser may be controlled by adjusting the depth or thickness of the barrier layer, which makes it possible that the laser with various intensities illuminates the respective pixels at the sane time and charge trap regions with various depths are easily formed for the respective pixels. The fabrication method according to embodiments of the present invention may reduce the process for forming the charge trap region 20 with various depths compared with a multiple ion-injecting process, and thus advantageously affect fabrication yield.

Figure 6A:
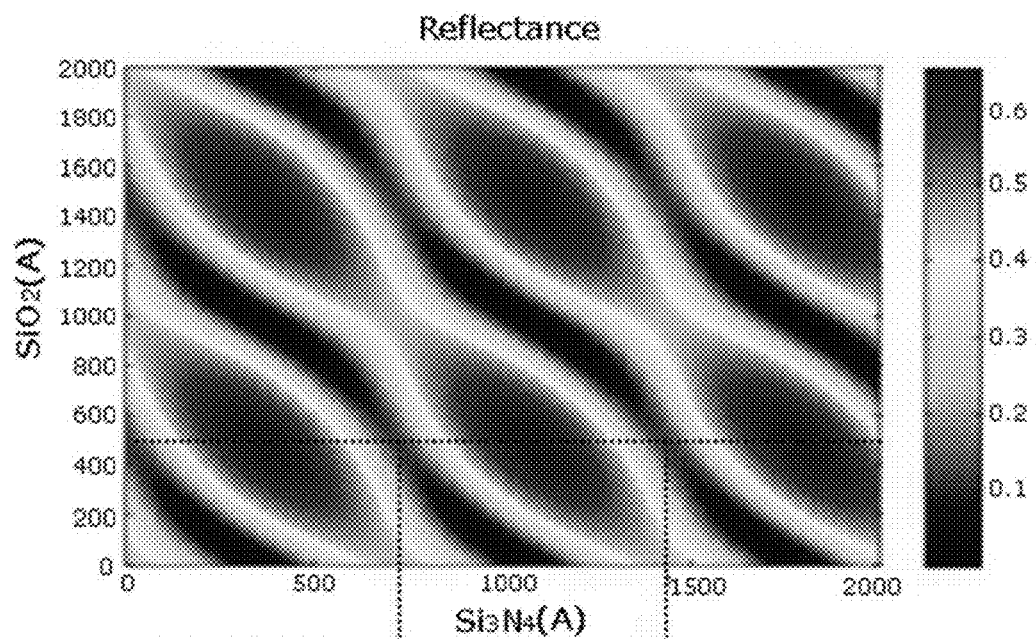
FIG. 6A is a graph illustrating laser reflectance with respect to the thickness of a barrier layer (oxide/nitride) in accordance with an embodiment of the present invention.

FIG. 6A is a graph illustrating laser reflectance with respect to the thickness of the barrier layer (oxide/nitride) in accordance with an embodiment of the present invention.

Referring to FIG. 6A, it can be seen that the reflectance of the laser illuminated to a laminate, where the silicon oxide ($SiO_2$) or the buffer layer 18 and the silicon nitride ($Si_3N_4$)

or the barrier layer 19A are sequentially stacked, fluctuates with regularity as the depth of the silicon nitride increases with the fixed depth of the silicon oxide, which means that intensity of the laser penetrating the laminate may be controlled by adjusting the depth or thickness of the silicon nitride and/or the silicon oxide of the laminate.

The intensity of the laser penetrating the laminate depends on the depth or thickness of the laminate even though the laser radiates to the laminate with the same intensity. Therefore, according to the embodiment of the present invention, the charge trap region with various depths or thicknesses may be easily formed with a one time use of the laser annealing process with the barrier pattern selectively formed or the barrier pattern whose thickness is adjusted depending on characteristics of respective pixels.

Figure 6B:
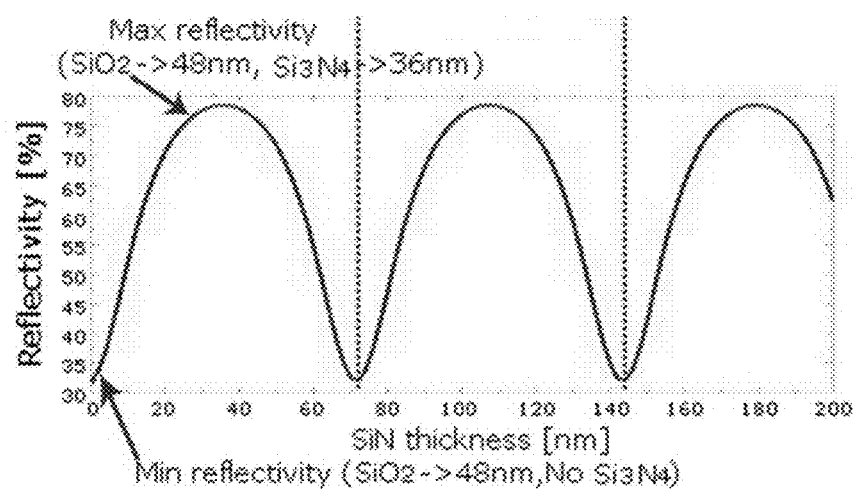
FIG. 6B is a graph illustrating the depth of charge trap region with respect to laser intensity during laser annealing in accordance with an embodiment of the present invention.

FIG. 6B is a graph illustrating the depth of the charge trap region with respect to laser intensity during laser annealing in accordance with an embodiment of the present invention.

Referring to FIG. 6B, it is shown that the depth of the dopant region activated by the laser annealing or the depth of the charge trap region is controlled by the intensity of the laser. As the intensity of the laser increase, the depth of the charge trap region increases.

Figure 7:
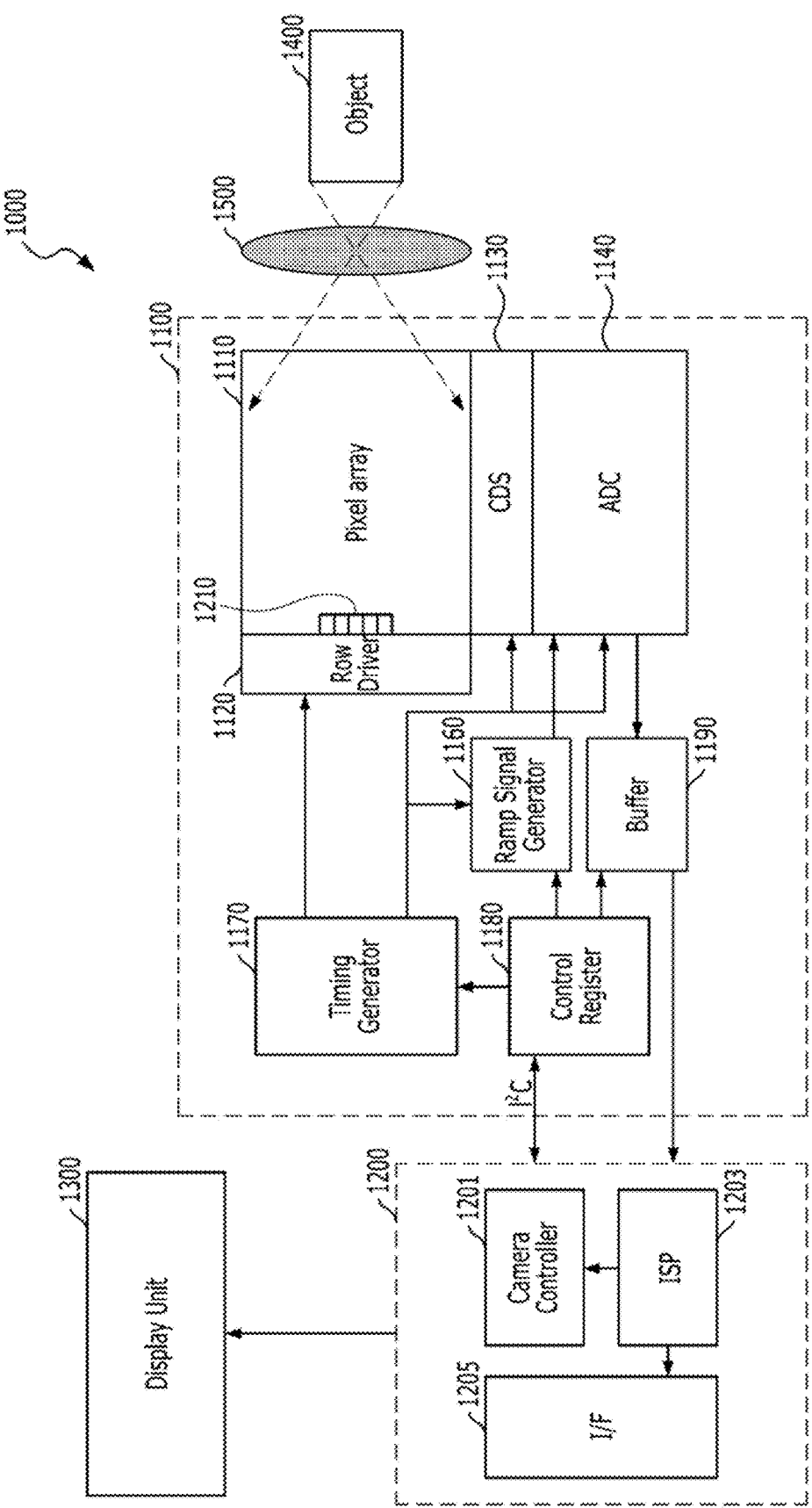
FIG. 7 is a block diagram illustrating an image processing system including a pixel array in accordance with an embodiment of the present invention.

FIG. 7 is a block diagram illustrating an image processing system including a pixel array in accordance with an embodiment of the present invention.

Referring to FIG. 7, the image processing system 1000 may include an image sensor 1100, a digital signal processor (DSP) 1200, a display unit 1300 and a lens module 1500.

The image sensor 1100 may include a pixel array 1110, a row driver 1120, a correlated double sampling (CDS) block 1130, an analogue to digital converter (ADC) 1140, a ramp signal generator 1160, a timing generator 1170, a control register 1180 and a buffer 1190.

The image sensor 1100 may detect an optical image of an object 1400 photographed by the lens module 1500 under the control of the digital signal processor (DSP) 1200. The digital signal processor (DSP) 1200 may output to the display unit 1300 an image detected and outputted by the image sensor 1100. The display unit 1300 may represent a device capable of displaying the image outputted from the digital signal processor (DSP) 1200. For example, the display unit 1300 may be a terminal of a computer, a mobile communication apparatus and other image display apparatuses.

The digital signal processor (DSP) 1200 may include a camera controller 1201, an image signal processor (ISP) 1203 and an interface (I/F) 1205.

The camera controller 1201 may control operation of the control resistor 1180. The camera controller 1201 may control operation of the image sensor 1100 or the control register 1180 by using an inter-integrated circuit I²C, which does not limit the scope of the present invention.

The image signal processor (ISP) 1203 may receive an image or an image data, process the received image and output the processed image through the interface (I/F) 1205 to the display unit 1300.

For example, FIG. 7 shows that the image signal processor (ISP) 1203 is included in the digital signal processor (DSP) 1200. The image signal processor (ISP) 1203 may be disposed in the image sensor 1100 according to system design. The image sensor 1100 and the image signal processor (ISP) 1203 may be put together in a package, for example as a multi-chip package (MCP).

The pixel array 1110 may include the pixel array in accordance with an embodiment of the present invention. Each of the plurality of pixels in the pixel array 1110 may include the photoelectric conversion region and the charge trap region overlapping with the photoelectric conversion region and having a depth corresponding to a wave band of incident light inputted thereto. In accordance with the embodiments of the present invention, the image processing system may prevent generation of the dark current and deterioration of sensitivity due to the charge trap region, which may improve operation properties of the image sensor.

Figure 8:
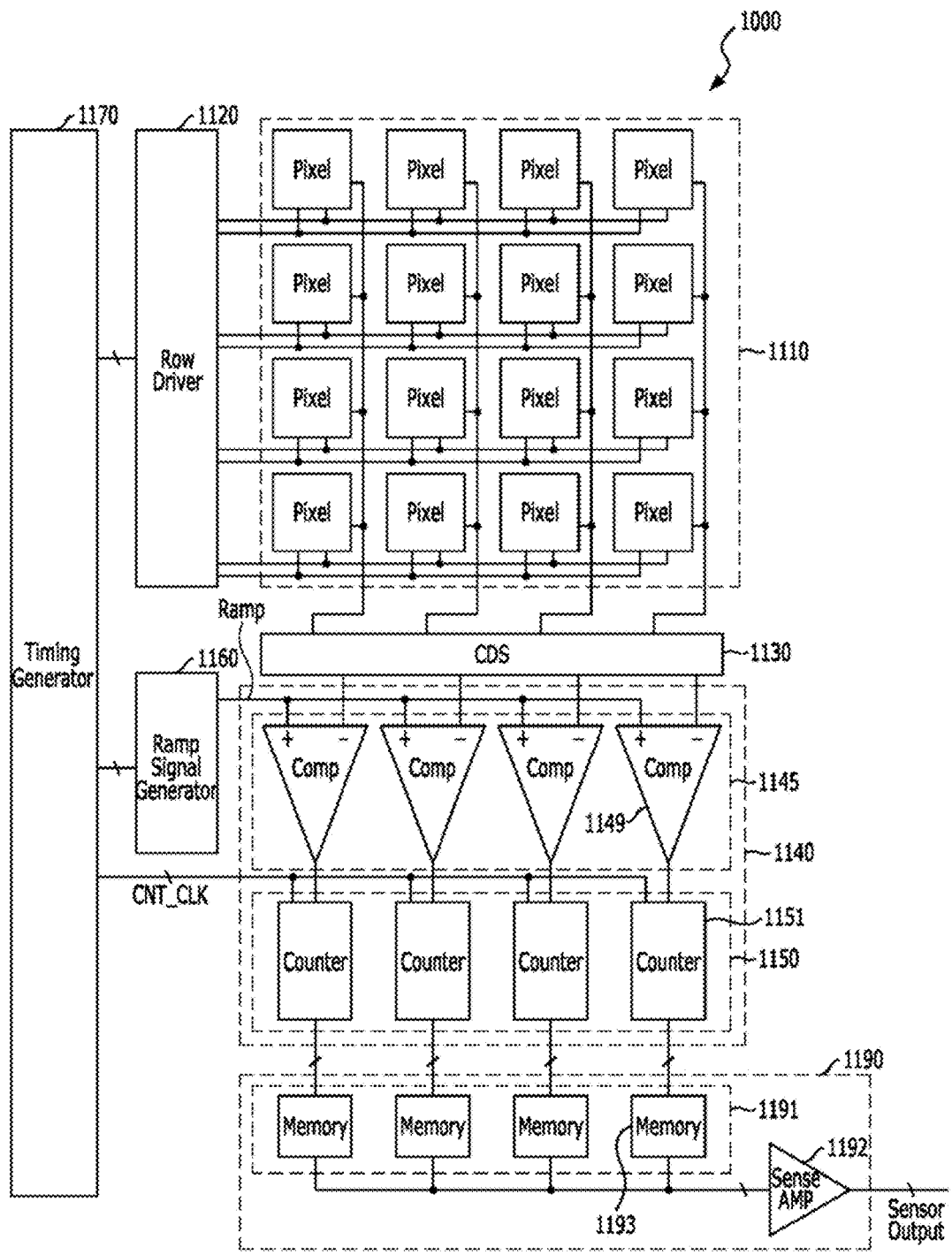
FIG. 8 is a detailed block diagram illustrating an image sensor shown in FIG. 7.

FIG. 8 is a detailed block diagram illustrating an image sensor shown in FIG. 7.

Referring to FIGS. 7 and 8, the timing generator 1170 may generate one or more control signals for controlling each of the row driver 1120, the correlated double sampling (CDS) block 1130, the analogue to digital converter (ADC) 1140 and the ramp signal generator 1160. The control register 1180 may generate one or more control signals for controlling the ramp signal generator 1160, the timing generator 1170 and the buffer 1190. The control register 1180 may be controlled by the camera controller 1201.

The row driver 1120 may drive the pixel array by a row as a unit. For example, the row driver 1120 may generate a selection signal for selecting one of the plurality of rows. Each of the plurality of rows may include a plurality of pixels. FIG. 8 shows simplified disposition of the plurality of pixels for clear description. The plurality of pixels may include the pixel array described above.

The plurality of pixels may detect illuminating incident light and output an image reset signal and an image signal to the correlated double sampling (CDS) block 1130. The pixel array in accordance with the embodiment of the present invention may prevent generation of the dark current and deterioration of sensitivity due to the charge trap region, which may generate with good quality a pixel signal or the image reset signal and the image signal. The correlated double sampling (CDS) block 1130 may perform a correlated double sampling to each of the received image reset signal and the image signal.

The analogue to digital converter (ADC) 1140 may compare a ramp signal outputted from the ramp signal generator 1160 and the correlated double sampled signal outputted from the correlated double sampling (CDS) block 1130 to output a comparison result signal, count transition time of the comparison result signal and output the counted value to the buffer 1190.

The analogue to digital converter (ADC) 1140 may include a comparing block 1145 and a counter block 1150. The comparing block 1145 may include a plurality of comparators 1149. Each of the plurality of comparators 1149 may be connected to the correlated double sampling (CDS) block 1130 and the ramp signal generator 1160. The plurality of output signals from the correlated double sampling (CDS) block 1130 may be inputted to a first terminal, for example a negative terminal, of the respective comparators 1149 and the ramp signal from the ramp signal generator 1160 may be inputted to a second terminal, for example a positive terminal, of each of the comparators 1149.

The plurality of comparators 1149 may receive and compare the respective output signals from the correlated double sampling (CDS) block 1130 and the ramp signal from the ramp signal generator 1160 and output the comparison result signals, respectively. For example, a comparison result signal outputted from a first comparator 1149 for comparing an output signal from one of the plurality of pixels and the ramp signal from the ramp signal generator 1160 may correspond to a difference between the image signal and the image reset signal that varies depending on illuminance of incident light inputted from outside.

The ramp signal generator 1160 may operate under the control of the timing generator 1170.

The counter block 1150 may include a plurality of counters 1151. The plurality of counters 1151 may be connected to respective output terminals of the plurality of comparators 1149. The counter block 1150 may count the transition time of the comparison result signal using a clock signal CNT_CLK outputted from the timing generator 1170 and output a digital signal or the counted value to the buffer 1190. The counter block 1150 may output a plurality of digital image signals. Each of the counters 1151 may be an up/down counter or bit-wise inversion counter.

The buffer 1190 may store, sense, amplify and output the plurality of digital image signals outputted from the analogue to digital converter (ADC) 1140. The buffer 1190 may include a memory block 1191 and a sense amplifier 1192. The memory block 1191 may include a plurality of memories 1193 storing the respective counted value outputted from the plurality counters 1151. For example, the counted value may represent a counted value with respect to a signal outputted from the plurality of pixels.

The sense amplifier 1192 may sense and amplify each of the counted values outputted from the memory block 1191. The image sensor 1100 may output the image data to the digital signal processor (DSP) 1200.

Figure 9:
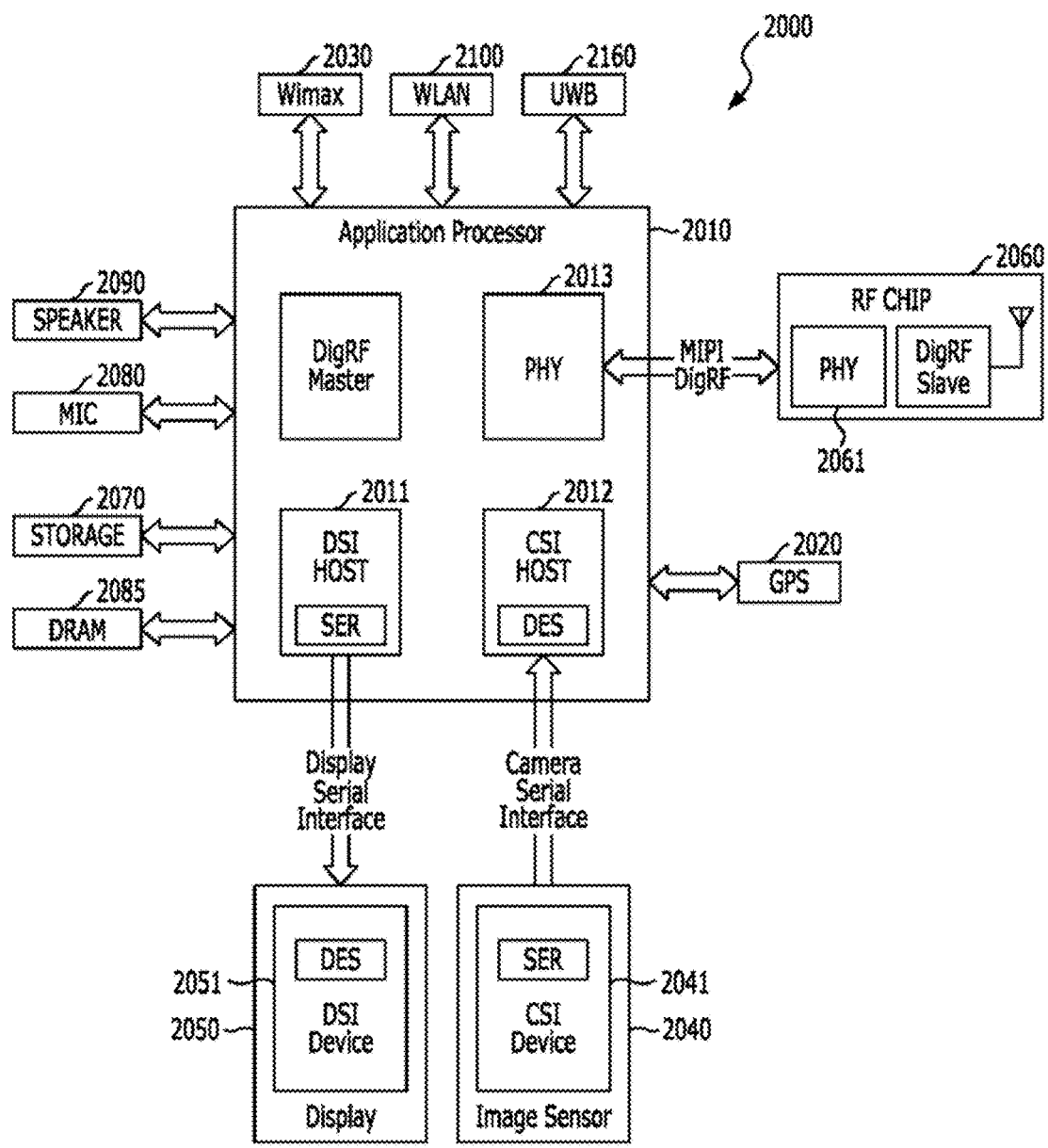
FIG. 9 is a block diagram illustrating an image processing system including an image sensor in accordance with an embodiment of the present invention.

FIG. 9 is a block diagram illustrating an image processing system including an image sensor in accordance with an embodiment of the present invention.

Referring to FIG. 9, the image processing system 2000 may be a data processing apparatus using or supporting mobile industry processor interfaces (MIPI) such as a mobile communication apparatus for example, a personal digital assistant (PDA), a mobile phone or a smart phone. The image processing system 2000 may be a portable apparatus such as a tablet computer.

The image processing system 2000 may include an application processor 2010, an image sensor 2040 and a display 2050.

A camera serial interface (CSI) host 2012 in the application processor 2010 may perform serial communication with CSI device 2041 of the image sensor 2040 through a camera serial interface (CSI). The image sensor 2040 may include the image sensor in accordance with an embodiment of the present invention. A display serial interface (DSI) host 2011 may perform serial communication with DSI device 2051 of the display 2050 through a display serial interface (DSI).

The image processing system 2000 may further include a radio frequency (RF) chip 2060 capable of performing communication with the application processor 2010. A physical layer (PHY) 2013 of the application processor 2010 and a physical layer (PHY) 2061 of the radio frequency (RF) chip 2060 may exchange data according to mobile industry processor interface (MIPI) digital radio frequency (DigRF).

The image processing system 2000 may further include a geographic positioning system (GPS) 2020, a data storage device 2070, a memory 2085 such as dynamic random access memory (DRAM) and a speaker 2090. The image processing system 2000 may perform communication through a worldwide interoperability for microwave access (Wimax) unit 2030, a wireless local area network (WLAN) unit 2100 and an ultra-wideband (UWB) unit 2110.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
a substrate having photoelectric conversion regions respectively formed on a plurality of pixels; and
charge trap regions overlapping with the respective photoelectric conversion regions and having depths or thicknesses that are different, for each of the respective pixel,
wherein each of the photoelectric conversion regions includes:
a first dopant region of a first conductivity type; and
a second dopant region of a second conductivity type that is complementary to the first conductivity type, and
wherein the charge trap region corresponding to the photoelectric conversion region includes a dopant region of the first conductivity type,
wherein the first dopant region is formed at a surface of a front side of the substrate, the second dopant region is formed in contact with the first dopant region and the charge trap region is formed at a surface of a rear side of the substrate, and the first dopant region, the second dopant region and the charge trap region are overlapped with each other and sequentially stacked,
wherein the second dopant region and the charge trap region are in contact with each other, the second dopant region and the charge trap region have a depth or thickness that are different for each pixel, and
the depth or thickness of the second dopant region is inversely proportional to the depth or thickness of the charge trap region.

2. An image sensor comprising:
a substrate having a first pixel suitable for generating a first pixel signal in response to an incident light of a first wavelength band, and
a second pixel suitable for generating a second pixel signal in response to an incident light of a second wavelength band;
first and second photoelectric conversion regions respectively formed on the substrate corresponding to the first pixel and the second pixel;
a first charge trap region overlapped with the first photoelectric conversion region; and
a second charge trap region overlapped with the second photoelectric conversion region,
wherein a wavelength of the second wavelength band is shorter than a wavelength of the first wavelength band, and a depth or thickness of the second charge trap region is smaller than a depth or thickness of the first charge trap region,
wherein each of the photoelectric conversion regions includes:
a first dopant region of a first conductivity type formed at a surface of a front side of the substrate; and
a second dopant region of a second conductivity type that is complementary to the first conductivity type formed in contact with the first dopant region, and
wherein each of the first charge trap region and the second charge trap region includes a dopant region of the first conductivity type and is formed at a surface of a rear side of the substrate, and
wherein the first dopant region, the second dopant region, and the first or second charge trap region are overlapped with each other and sequentially stacked,
wherein the second dopant region and the first or second charge trap region are in contact with each other, the second dopant region, the first charge trap region and the second charge trap region have depths or thicknesses different from each other, and the depth or thickness of the second dopant region is inversely proportional to the depth or thickness of the first or second charge trap region.

3. A method of fabricating an image sensor comprising:
forming photoelectric conversion regions on a front side of a substrate having a plurality of pixels corresponding to the respective pixels;
forming a dopant-injection region through ion-injection of a dopant to a rear side of the substrate;
selectively forming a barrier pattern on the rear side of the substrate for each of the plurality of pixels; and
forming charge trap regions having different depths or thicknesses from each other for the respective pixels through a laser annealing for activating the dopant of the dopant-injection region,
wherein the selective forming of the barrier pattern includes:
forming a barrier layer on the rear side of the substrate; and
forming the barrier pattern through selective etching of the barrier layer,
wherein the plurality of pixels include:
a first pixel suitable for generating a first pixel signal in response to an incident light of a first wavelength band; and
a second pixel suitable for generating a second pixel signal in response to an incident light of a second wavelength band,
wherein a wavelength of the second wavelength band is shorter than a wavelength of the first wavelength band, and the forming of the barrier pattern through the selective etching of the barrier layer includes forming the barrier pattern of a first thickness corresponding to the first pixel and the barrier pattern of a second thickness greater than the first thickness corresponding to the second pixel.

4. The method of claim 3, wherein in the forming of the charge trap regions, the charge trap region increases in depth or thickness for a longer wavelength of an incident light inputted through the pixel of the charge trap region.

5. A method of fabricating an image sensor comprising:
forming photoelectric conversion regions on a front side of a substrate having a plurality of pixels corresponding to the respective pixels;
forming a dopant-injection region through ion-injection of a dopant to a rear side of the substrate;
selectively forming a barrier pattern on the rear side of the substrate for each of the plurality of pixels; and
forming charge trap regions having different depths or thicknesses from each other for the respective pixels through a laser annealing for activating the dopant of the dopant-injection region,
wherein the selective forming of the barrier pattern includes:
forming a barrier layer on the rear side of the substrate; and
forming the barrier pattern through selective etching of the barrier layer,
wherein the plurality of pixels include:
a first pixel suitable for generating a first pixel signal in response to an incident light of a first wavelength band, and
a second pixel suitable for generating a second pixel signal in response to an incident light of a second wavelength band,
wherein a wavelength of the second wavelength band is shorter than a wavelength of the first wavelength band, and the forming of the barrier pattern through the selective etching of the barrier layer includes forming the barrier pattern corresponding to the second pixel by removing the barrier layer corresponding to the first pixel.

* * * * *